United States Patent
Testa et al.

(10) Patent No.: US 8,846,494 B2
(45) Date of Patent: Sep. 30, 2014

(54) ALIGNMENT MARKS AND ALIGNMENT METHODS FOR ALIGNING BACKSIDE COMPONENTS TO FRONTSIDE COMPONENTS IN INTEGRATED CIRCUITS

(75) Inventors: Gianluca Testa, Avezzano (IT); Giovanni De Amicis, L'Aquila (IT)

(73) Assignee: Aptina Imaging Corporation, George Town (KY)

( * ) Notice: Subject to any disclaimer, the term of this patent is extended or adjusted under 35 U.S.C. 154(b) by 74 days.

(21) Appl. No.: 13/540,905

(22) Filed: Jul. 3, 2012

(65) Prior Publication Data

US 2013/0009268 A1    Jan. 10, 2013

Related U.S. Application Data

(60) Provisional application No. 61/505,492, filed on Jul. 7, 2011.

(51) Int. Cl.
| H01L 21/30 | (2006.01) |
| H01L 23/544 | (2006.01) |
| H01L 27/146 | (2006.01) |

(52) U.S. Cl.
CPC ........ *H01L 27/14636* (2013.01); *H01L 23/544* (2013.01); *H01L 27/1464* (2013.01); *H01L 27/14687* (2013.01)
USPC ....................... 438/455; 438/70; 257/E23.179

(58) Field of Classification Search
CPC .. H01L 24/04; H01L 23/544; H01L 2223/544
USPC .............. 438/70, 455; 257/E21.122, E23.179
See application file for complete search history.

(56) References Cited

U.S. PATENT DOCUMENTS

| 6,768,213 B2 | 7/2004 | Holscher et al. |
| 6,838,689 B1 | 1/2005 | Deng et al. |
| 6,861,186 B1 | 3/2005 | Pagette et al. |
| 6,979,651 B1 | 12/2005 | Hellig et al. |
| 7,064,807 B2 | 6/2006 | Gui et al. |
| 7,256,865 B2 | 8/2007 | Consolini et al. |
| 7,611,960 B2 | 11/2009 | Liu et al. |
| 2004/0157408 A1 | 8/2004 | Best et al. |
| 2005/0073669 A1 | 4/2005 | Best et al. |
| 2005/0115065 A1* | 6/2005 | Wilkins ........................ 29/831 |
| 2006/0114442 A1 | 6/2006 | Van Buel |
| 2006/0226118 A1 | 10/2006 | Baluswamy et al. |
| 2008/0020488 A1* | 1/2008 | Clevenger et al. ................ 438/3 |
| 2009/0321888 A1* | 12/2009 | Liu et al. ........................ 257/618 |
| 2010/0006909 A1 | 1/2010 | Brady |
| 2011/0207250 A1* | 8/2011 | Uya ............................... 438/24 |
| 2013/0181348 A1* | 7/2013 | Oliver et al. ................... 257/737 |

OTHER PUBLICATIONS

Testa et al., U.S. Appl. No. 13/309,809, filed Dec. 2, 2011.

* cited by examiner

*Primary Examiner* — William F Kraig
*Assistant Examiner* — Joseph C Nicely
(74) *Attorney, Agent, or Firm* — Treyz Law Group; David C. Kellogg

(57) ABSTRACT

An imaging system may include an imager integrated circuit with frontside components such as imaging pixels and backside components such as color filters and microlenses. The imager integrated circuit may be mounted to a carrier wafer with alignment marks. Bonding marks on the carrier wafer and the imager integrated circuit may be used to align the carrier wafer accurately to the imager integrated circuit. The alignment marks on the carrier wafer may be read, by fabrication equipment, to align backside components of the imager integrated circuit, such as color filters and microlenses, with backside components of the imager integrated circuit, such as photodiodes.

12 Claims, 7 Drawing Sheets

ALIGNMENT MARKS AND ALIGNMENT METHODS FOR ALIGNING BACKSIDE COMPONENTS TO FRONTSIDE COMPONENTS IN INTEGRATED CIRCUITS

This application claims the benefit of provisional patent application No. 61/505,492, filed Jul. 7, 2011, which is hereby incorporated by reference herein in its entirety.

BACKGROUND

This relates generally to integrated circuits and, more particularly, to alignment marks and alignment methods for aligning backside components to frontside components.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals.

Modern imagers, and other integrated circuits, are sometimes formed from integrated circuits having frontside and backside components. The accuracy of conventional techniques for aligning frontside components to backside components, which typically rely upon infrared alignment systems not capable of accuracies less than one micrometers, are undesirable in at least some situations.

It would therefore be desirable to provide alignment marks and alignment methods for aligning backside components to frontside components in integrated circuits.

DETAILED DESCRIPTION

Figure 1:
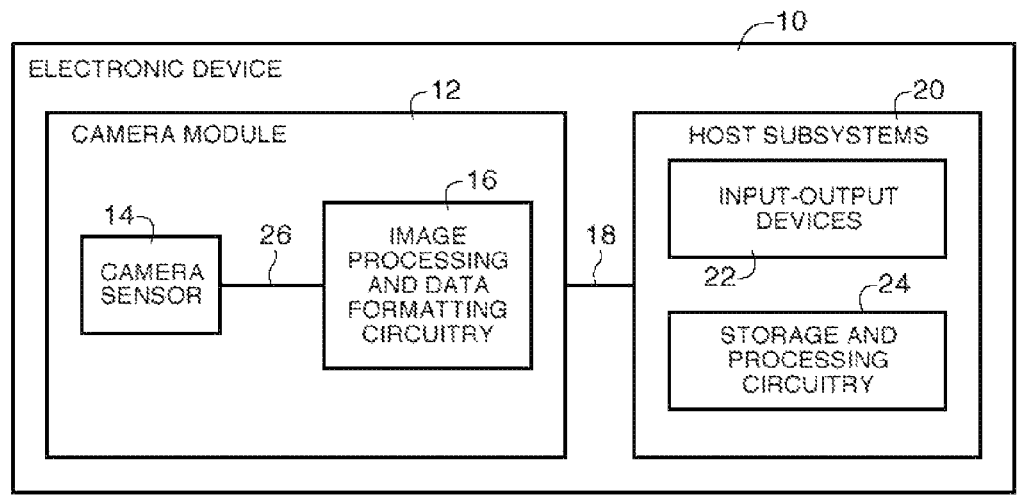
FIG. 1 is a diagram of an illustrative integrated circuit with image sensor circuitry that may include an integrated circuit having frontside and backside components and having alignment marks in accordance with an embodiment of the present invention.

An electronic device is shown in FIG. 1. Electronic device 10 may have a digital camera module. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels).

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Integrated circuits used to implement camera sensor 14 and, if sensor 14 and circuitry 16 are implemented on integrated chips together in a system on chip arrangement, image processing and data formatting circuitry 16 may be formed on a wafer (e.g., a silicon wafer) in a batch process. The camera sensors 14 on such a wafer, or any other integrated circuits in device 10, may be formed from integrated circuits having frontside and backside components aligned using alignment marks on a carrier wafer. The alignment marks on the carrier wafer may facilitate accurate alignment of the backside components to the frontside components.

As one example, an integrated circuit may include a backside illuminated imager integrated circuit stacked together with, and aligned to, a permanent carrier wafer. The backside illuminated imager integrated circuit may include backside structures such as light shields, color filters, lens structures, interconnects and circuitry, that may require alignment with photodiodes, circuitry, and other components formed on the frontside of the imager integrated circuit. Conventional techniques for aligning frontside and backside components in an integrated circuit rely typically upon infrared alignment systems having limited accuracies on the order of a few micrometers (e.g., 1-2 µm). Alignment marks described below in connection with various embodiments of the present invention may allow alignment of frontside and backside components in these and other types of integrated circuits with improved accuracies on the order of a one micron (e.g., approximately 1.0 microns). The higher accuracies provided by the various embodiments of the present invention may allow integrated circuits having frontside and backside components to be utilized in imaging applications and other applications requiring high levels of precision (e.g., applications that could not be implemented using traditional infrared alignment techniques).

Figure 2:
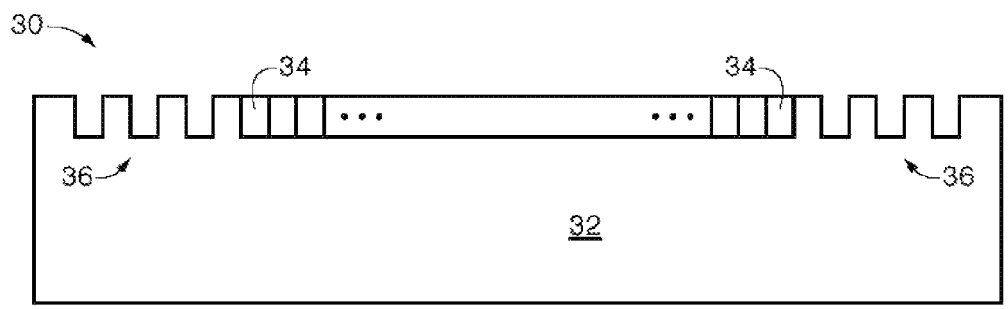
FIG. 2 is a cross-sectional side view of an illustrative device wafer that may include frontside components such as photodiodes and frontside alignment marks in accordance with an embodiment of the present invention.

Portions of an illustrative integrated circuit 30 such as device wafer 30 are shown in FIG. 2. Circuit 30 may be a camera sensor such as sensor 14 of FIG. 1 or may, in general, be another type of circuit.

Circuit 30 may include, as examples, substrate 32, components 34 formed in the frontside of substrate 32, and alignment marks 36. Substrate 32 may be a silicon substrate. Frontside components 34 may include, as examples, photodiodes, diodes, floating diffusion storage nodes, transistors such as reset transistors, source-follower transistors, reset transistors, transfer transistors, and row select transistors, and other integrated circuit components.

Alignment marks 36 may, as an example, be formed from openings etched into silicon substrate 32. If desired, the openings etched into silicon substrate 32 may be lined or filled with material to as part of forming alignment marks 36. With at least one suitable arrangement, alignment marks 36 may be formed from conventional alignment marks (e.g., conventional combi marks such as ASML alignment marks).

Figure 3:
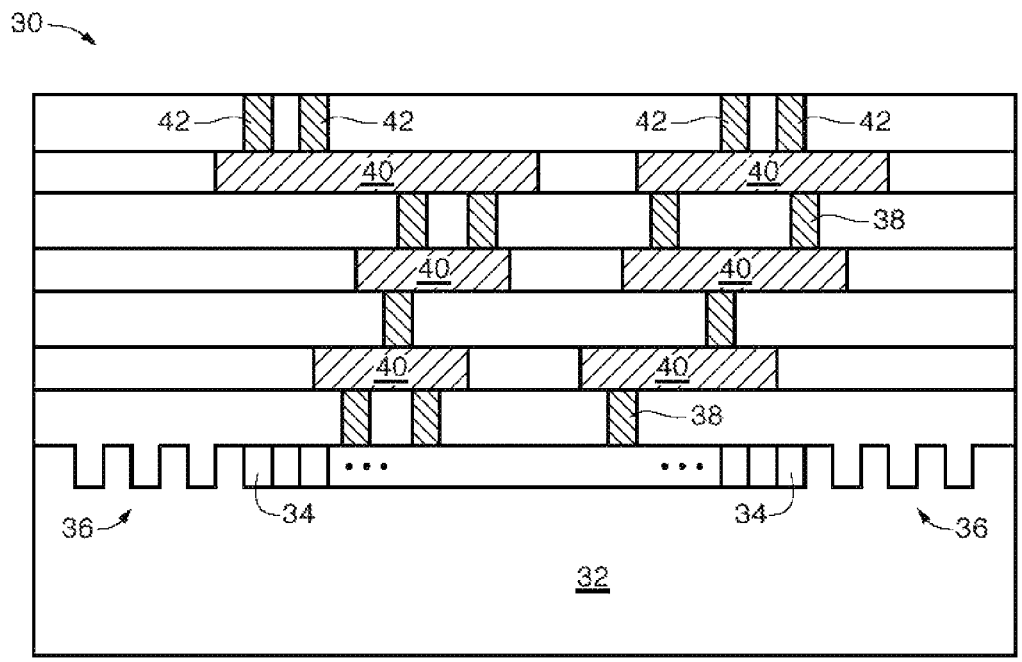
FIG. 3 is a cross-sectional side view of the illustrative device wafer of FIG. 2 showing additional frontside layers that may be formed on the device wafer and that may include components such as metal lines, metal vias, and bonding marks in accordance with an embodiment of the present invention.

As shown in FIG. 3, layers of conductive vias 38 and lines 40 (e.g., layers V1, M1, V2, M2, etc.) may be formed above components 34 on the frontside of substrate 32. Any desired number of layers of metal vias and lines may be formed above substrate 32. Conductive vias 38 and lines 40 may interconnect components 34 with each other and may connect components 34 to other circuits and components (e.g., metal vias 38 and metal lines 40 may form part of path 26 coupling photodiodes 34 to external circuitry such as image processing and data formatting circuitry 16).

Integrated circuit 30 may include bonding marks such as bonding marks 42. Bonding marks 42 may, or may not be, electrically connected to the underlying metal lines 40 and conductive vias 38. Bonding marks 42 may, as an example, be formed from openings etched into metal or via layer dielectric above silicon substrate 32. Bonding marks 42 may sometimes be referred to herein as alignment marks 42. If desired, the openings etched into the metal or via layer dielectric may be lined or filled with material to as part of forming bonding marks 42. With one suitable arrangement, frontside bonding marks 42 may be aligned with frontside alignment marks 36. Frontside bonding marks 42 may, during a later stage of fabrication, be used to align device wafer 30 (e.g., integrated circuit 30) with a carrier wafer (e.g., with alignment marks on the carrier wafer, such that the alignment marks of the carrier wafer can be used an alignment reference for device wafer 30). As an example, frontside bonding marks 42 may be aligned to frontside alignment marks 36 with an accuracy of approximately 100 nanometers.

Figure 4:
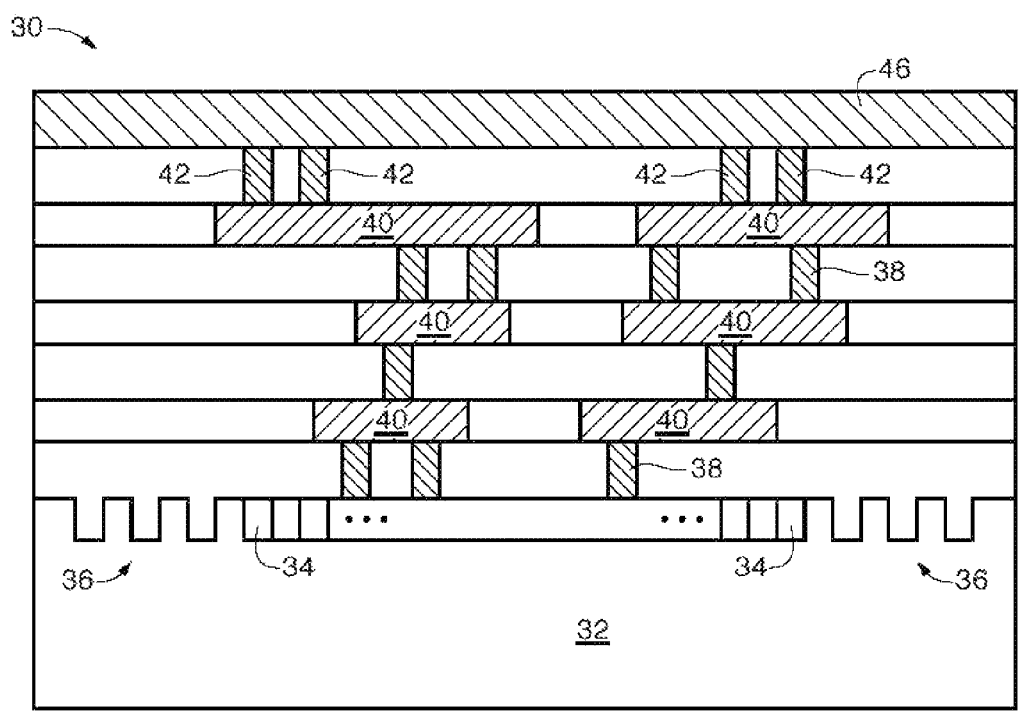
FIG. 4 is a cross-sectional side view of the illustrative device wafer of FIG. 3 and a bonding layer such as an oxide layer that may be formed on the device wafer in accordance with an embodiment of the present invention.

As shown in FIG. 4, a bonding layer such as oxide layer 46 may be formed on circuit 30. Oxide bonding layer 46 may be formed above metal via layers and metal interconnect layers. Oxide bonding layer 46 may, as an example, facilitate the bonding of a carrier wafer as shown in FIG. 7.

Figure 5:
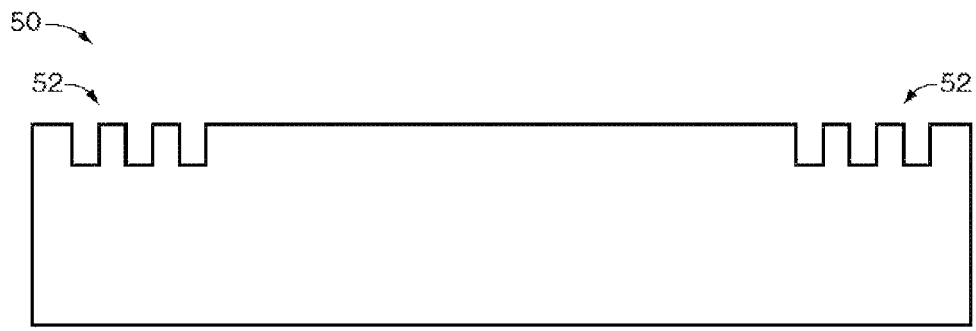
FIG. 5 is a cross-sectional side view of an illustrative wafer such as a carrier wafer that may include backside alignment marks in accordance with an embodiment of the present invention.

FIG. 5 shows an illustrative carrier wafer such as carrier wafer 50, which may eventually be bonded to device wafer 30. As shown in FIG. 5, carrier wafer 50 may include backside alignment marks 52. With at least one suitable arrangement, alignment marks 52 may be formed from conventional alignment marks (e.g., conventional combi marks such as ASML alignment marks).

Figure 6:
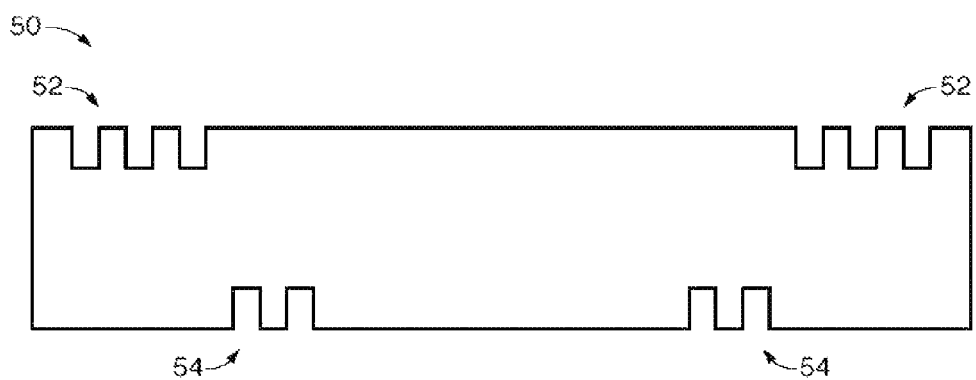
FIG. 6 is a cross-sectional side view of the illustrative carrier wafer of FIG. 5 showing that the carrier wafer may include frontside bonding marks that may be aligned to the backside alignment marks using fabrication equipment in accordance with an embodiment of the present invention.

As shown in FIG. 6, carrier wafer 50 may include frontside marks such as frontside bonding marks 54. With at least one suitable arrangement, frontside bonding marks 54 may be aligned to backside alignment marks 52 with an accuracy of approximately 100 nanometers. Frontside bonding marks 54 may be located with respect to backside alignment marks 52 with high accuracy (e.g., an accuracy of approximately 100 nanometers) using fabrication equipment such as dual-side alignment equipment.

Figure 7:
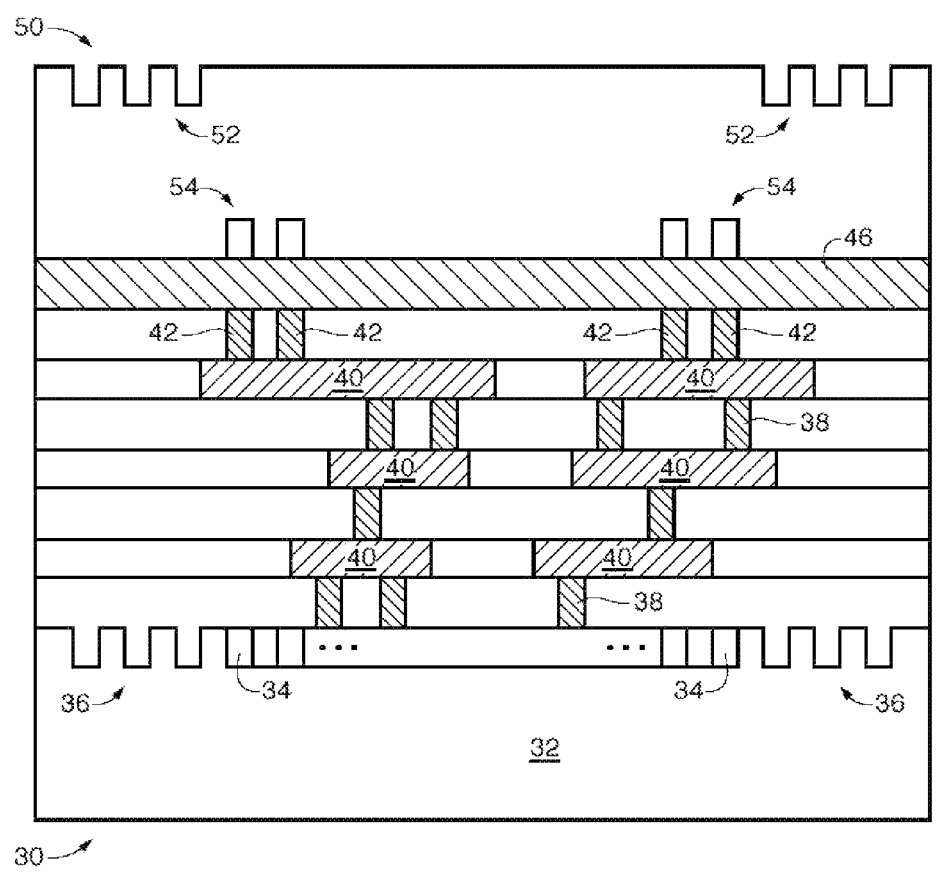
FIG. 7 is a cross-sectional side view of the illustrative carrier wafer of FIG. 6 and the illustrative device wafer of FIG. 4 showing that the carrier and device wafers may be stacked (e.g., bonded) to each other and the carrier and device wafers may be aligned to each other using the frontside bonding marks of the carrier wafer and the bonding marks of the device wafer in accordance with an embodiment of the present invention.

FIG. 7 illustrates how a wafer such as carrier wafer 50 may be bonded to device wafer 30 (through bonding layer 46, if present). Wafer 50 may, as examples, be a permanent carrier wafer or a temporary carrier wafer (e.g., a wafer bonded and then removed during manufacturing processes).

As part of bonding carrier wafer 50 and device wafer 30 together, carrier wafer 50 (e.g., alignment marks 52 and bonding marks 54) may be aligned with device wafer 30 (e.g., alignment marks 36 and bonding marks 42). With one suitable arrangement, fabrication equipment may determine the positions of carrier wafer 50 and device wafer 30 using bonding marks 54 of carrier wafer 50 and bonding marks 42 of device wafer 30, respectively. The fabrication equipment may thereby us bonding marks 54 and 42 to align carrier wafer 50 to device wafer 30 with high accuracy (e.g., with an accuracy of approximately 1 micrometer). After carrier wafer 30 and device wafer 50 are bonded together, backside alignment marks 52 of carrier wafer 50 may be aligned to the frontside alignment marks 36 of device 30. With arrangements of this type, alignment marks 52 may be used by fabrication equipment to determine the position of device wafer 30 (and carrier wafer 50) for some or all subsequent fabrication steps, as alignment marks 36 may no longer be usable by the fabrication equipment since the carrier wafer 50 may block the fabrication equipment from viewing alignment marks 36.

Figure 8:
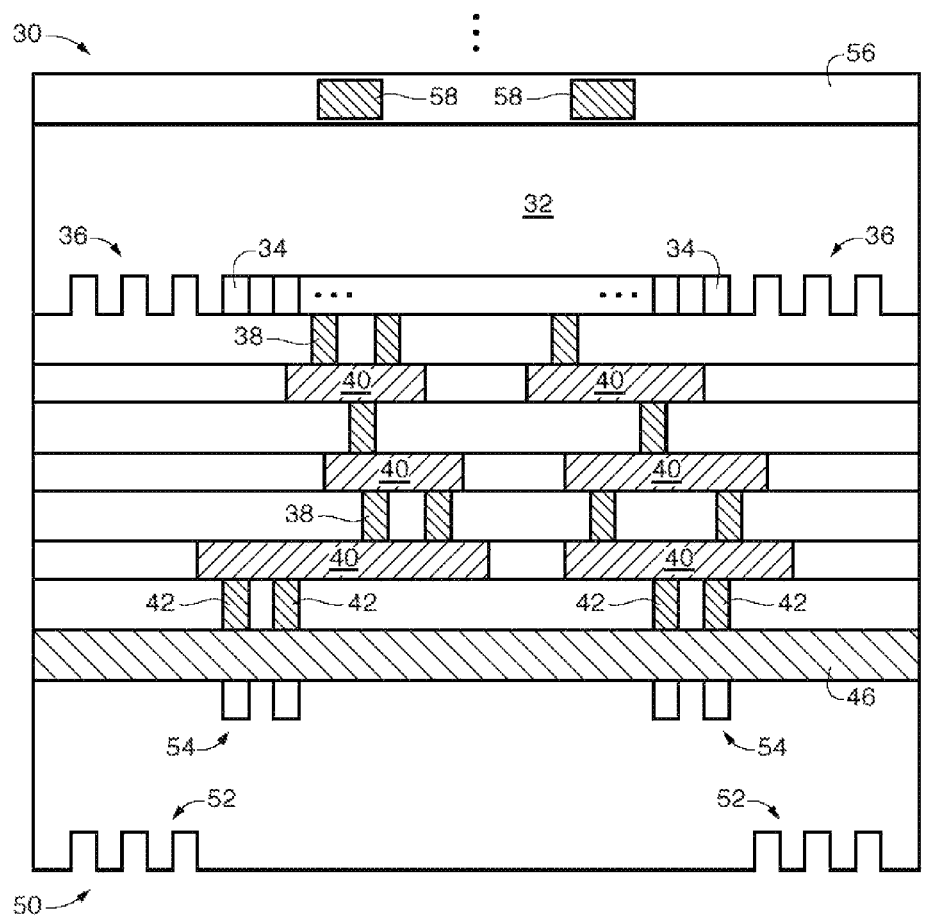
FIG. 8 is a cross-sectional side view of the illustrative carrier wafer of FIG. 6 and the illustrative device wafer of FIG. 4 showing that the backside alignment marks of the carrier wafer may be used by fabrication equipment in aligning the fabrication equipment to the carrier wafer in accordance with an embodiment of the present invention.

After carrier wafer 50 is bonded to device wafer 30, the resulting stack may be flipped over for thinning of substrate 32 and additional processing (as shown in FIG. 8). Any desired backside processing steps (e.g., processing steps applied to substrate 32 on the side opposite components 34) may be aligned to device wafer 30 (e.g., components 34) using alignment marks 52 of carrier wafer 50.

As shown in FIG. 8, additional layers 56 of components and materials may be formed on the backside of device wafer 30 (e.g., on substrate 32). The backside components in layers 56 may be aligned to components 34 in the frontside of substrate 32 (and to components in the metal and via layers M1, V1, etc., components in carrier wafer 50, etc.) using alignment marks 52 of carrier wafer 50. As illustrative examples, components, structures, and materials (illustrated as structures 58 in FIG. 8) that may be formed on the backside of substrate 32 (e.g., on the backside of a backside illuminated imager device) may include imaging (photo) layers such as color filters, light shield, backside circuitry and interconnects, passivation layers, lenses, microlenses, anti-reflection layers, light blocking structures (e.g., structures that reduce optical cross-talk), etc. If desired, backside color filter layers may include an array of color filters, each of which is aligned with a respective image sensing pixel in an array of backside illuminated image sensing pixels (formed on the frontside of substrate 32). In embodiments in which integrated circuit 30 is a device other than an imaging device, any desired components, structures, and materials may be formed on the backside of wafer 32 and, if desired, alignment marks 52 of carrier wafer 50 may be used in aligning those structures to wafers 30 and 50 (e.g., to frontside components in substrate 32). While many embodiments herein are described in the context of imagers, the embodiments described herein apply, in general, to all different types of integrated circuits.

Figure 9:
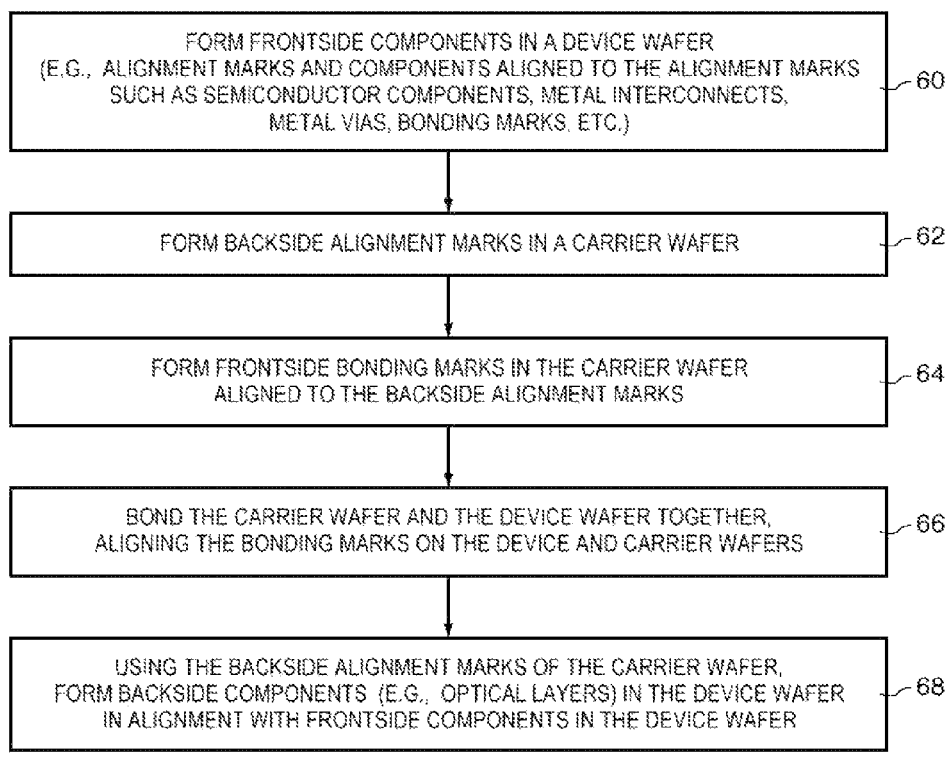
FIG. 9 is a flowchart of illustrative steps involved in aligning a carrier wafer and a device wafer using dual-side alignment fabrication equipment in accordance with an embodiment of the present invention.

A flowchart of illustrative steps involved in forming backside components aligned with frontside components in an integrated circuit is shown in FIG. 9.

In step 60, frontside components in integrated circuit 30 such as semiconductor components 34, metal vias 38, metal lines 40, and bonding marks 42 may be formed.

In step 62, backside alignment marks such as alignment marks 52 may be formed in a carrier wafer such as carrier wafer 50.

In step 64, frontside bonding marks such as bonding marks 54 may be formed in carrier wafer 50. The frontside bonding marks 54 may be formed in alignment with alignment marks 52 to an accuracy of approximately 100 nanometers using dual-side alignment fabrication equipment.

In step 66, device wafer 30 and carrier wafer 50 may be bonded together. Step 66 may include aligning carrier wafer 50 and device wafer 30 using bonding marks such as marks 42 and 54. With one suitable arrangement, wafers 30 and 50 may be aligned and bonded together with an accuracy of approximately 1 micron.

In step 68, backside components may be formed on device wafer 30. The backside components may include, as examples, optical layers such as light shields, color filters, lens structures, interconnects and circuitry, circuitry, and other components formed on the backside of the imager integrated circuit that may require alignment with frontside components such as photodiodes. The backside components may be aligned to frontside components, formed in step 60, using alignment marks 52 of carrier wafer 50.

Figure 10:
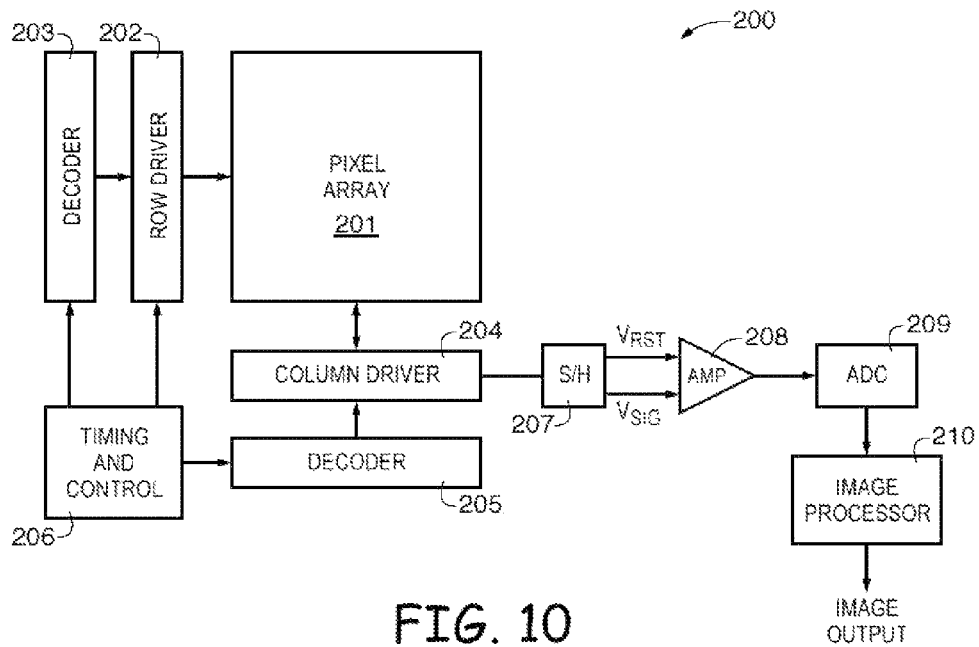
FIG. 10 is a block diagram of an imager employing the embodiment of FIG. 8 in accordance with an embodiment of the present invention.

FIG. 10 illustrates a simplified block diagram of imager 200 (e.g., a CMOS imager employing a carrier wafer having alignment marks aligned to components in a device wafer such as photosensors, where the alignment marks on the carrier wafer may be used in forming frontside components on the device wafer that are aligned to backside components on the device wafer as described herein). Pixel array 201 includes a plurality of pixels containing respective photosensors arranged in a predetermined number of columns and rows. The row lines are selectively activated by row driver 202 in response to row address decoder 203 and the column select lines are selectively activated by column driver 204 in response to column address decoder 205. Thus, a row and column address is provided for each pixel.

CMOS imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst and a pixel image signal Vsig for each pixel are sampled by sample and hold circuitry 207 associated with the column driver 204. A differential signal Vrst-Vsig is produced for each pixel, which is amplified by amplifier 208 and digitized by analog-to-digital converter 209. The analog to digital converter 209 converts the analog pixel signals to digital signals, which are fed to image processor 210 which forms a digital image.

Figure 11:
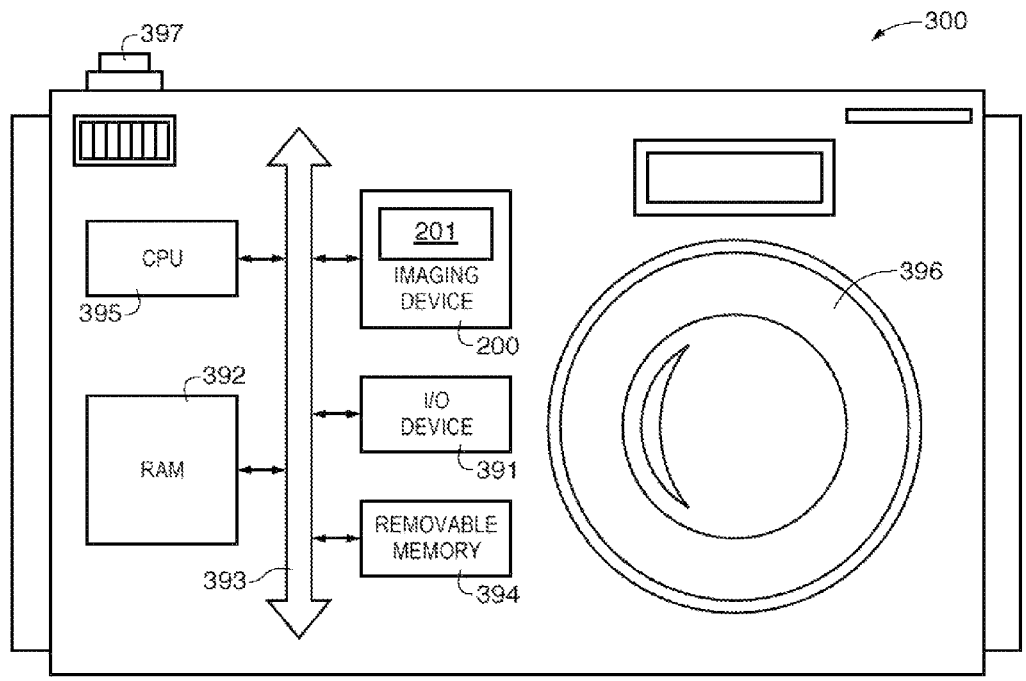
FIG. 11 is a block diagram of a processor system employing the imager of FIG. 10 in accordance with an embodiment of the present invention.

FIG. 11 shows in simplified form a typical processor system 300, such as a digital camera, which includes an imaging device such as imaging device 200 (e.g., an imaging device 200 such as imaging device 14 of FIG. 1 employing a device wafer and a carrier wafer such as wafers 30 and 50 of FIG. 8 constructed as described above). Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating alignment marks and alignment methods for aligning backside components to frontside components in integrated circuits.

An imaging system may include an imager integrated circuit with frontside components such as backside illuminated imaging pixels and backside optical layers. The imager integrated circuit may be formed with a device wafer that is aligned with and bonded to a carrier wafer. The carrier wafer may include alignment marks that are aligned to components within the device wafer to a high accuracy. With some arrangements, the alignment marks of the carrier wafer are aligned to components within the device wafer to an accuracy of approximately 1 micron. The carrier and device wafers may be aligned to each other using, as an example, bonding marks in the carrier and device wafers. Lithographic processes used in forming backside components (e.g., patterned light exposures) may be aligned to the integrated circuit (e.g., to frontside components in the device wafer) using the alignment marks in the carrier wafer, which have been previously aligned to the device wafer.

The foregoing is merely illustrative of the principles of this invention which can be practiced in other embodiments.

What is claimed is:

1. A method comprising:
   forming frontside components on a first side of a device substrate, wherein the frontside components include frontside bonding marks;
   forming alignment marks on a first side of a carrier substrate;
   forming bonding marks on a second side of the carrier substrate;
   aligning the device substrate to the carrier substrate, using the bonding marks in the second side of the device substrate and the bonding marks on the first side of the carrier substrate;
   bonding the aligned device and carrier substrates together; and
   forming backside components on a second side of the device substrate, wherein forming the backside components comprises aligning the backside components to the frontside components using the alignment marks on the first side of the carrier substrate.

2. The method defined in claim 1 wherein forming the alignment marks and the bonding marks on the carrier substrate comprises using dual-side alignment equipment to align the alignment marks to the bonding marks.

3. The method defined in claim 1 wherein aligning the backside components to the frontside components using the alignment marks on the first side of the carrier substrate comprises reading the alignment marks on the first side of the carrier substrate using fabrication equipment to determine the position of the device substrate relative to the fabrication equipment.

4. The method defined in claim 1 wherein forming the frontside components comprises forming an array of image sensing pixels.

5. The method defined in claim 4 wherein forming the backside components comprises forming a color filter layer.

6. The method defined in claim 1 wherein forming the frontside components comprises forming an array of backside illuminated image sensing pixels and forming metal interconnects and vias connected to the image sensing pixels.

7. A method of aligning backside components to frontside components in an integrated circuit wafer, the method comprising:
   forming alignment marks on a carrier wafer;
   bonding the carrier wafer to a frontside of the integrated circuit wafer; and
   forming the backside components on a backside of the integrated circuit wafer using the alignment marks on the carrier wafer to align the backside components to the frontside components.

8. The method defined in claim 7 further comprising:
   forming the frontside components in the integrated circuit wafer.

9. The method defined in claim 8 wherein forming the backside components on the backside of the integrated circuit wafer using the alignment marks on the carrier wafer comprises using an alignment system to read the alignment marks on the carrier wafer.

10. The method defined in claim 8 wherein forming the frontside components comprises forming an array of backside illuminated image sensing pixels.

11. The method defined in claim 10 wherein forming the backside components comprises forming an array of color filters, each of which is aligned above a respective one of the image sensing pixels.

12. The method defined in claim 7 wherein bonding the carrier wafer to the frontside of the integrated circuit wafer comprises aligning the alignment marks on the carrier wafer to the integrated circuit wafer.

* * * * *